United States Patent
Anami et al.

(10) Patent No.: US 8,126,682 B2
(45) Date of Patent: Feb. 28, 2012

(54) SUPPORT SYSTEM WITH IMPROVED REUSABILITY OF WORK HISTORY DATA AND DESIGN SUPPORT METHOD

(75) Inventors: Yasuyuki Anami, Okazaki (JP); Hiroshi Nakajima, Okazaki (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 2288 days.

(21) Appl. No.: 10/046,715

(22) Filed: Jan. 17, 2002

(65) Prior Publication Data

US 2002/0099461 A1    Jul. 25, 2002

(30) Foreign Application Priority Data

Jan. 19, 2001 (JP) .................. 2001-011027
Jun. 13, 2001 (JP) .................. 2001-179402

(51) Int. Cl.
*G06F 17/50* (2006.01)
*G06F 19/00* (2006.01)
*G06G 7/48* (2006.01)

(52) U.S. Cl. .................. 703/1; 703/6; 700/97
(58) Field of Classification Search .................. 703/1, 6, 703/7; 700/97, 98
See application file for complete search history.

(56) References Cited

U.S. PATENT DOCUMENTS

| | | | |
|---|---|---|---|
| 4,858,146 A * | 8/1989 | Shebini | 703/1 |
| 5,552,995 A * | 9/1996 | Sebastian | 700/97 |
| 5,687,304 A | 11/1997 | Kiss | |
| 5,806,069 A | 9/1998 | Wakiyama et al. | |
| 6,223,092 B1 | 4/2001 | Miyakawa et al. | |
| 6,557,002 B1 | 4/2003 | Fujieda et al. | |
| 6,725,184 B1 | 4/2004 | Gadh et al. | |
| 6,882,893 B2 | 4/2005 | Uchida et al. | |

FOREIGN PATENT DOCUMENTS

| | | |
|---|---|---|
| GB | 2 354 924 A | 4/2001 |
| JP | 11-45352 | 2/1999 |

OTHER PUBLICATIONS

Gill Barequet et al., "Repairing CAD Models", 1997, IEEE, pp. 363-370.*
Chee, K. C., et al., "Computer aided decoration of ceramic tableware. Part I: 3-D decoration," *Computers and Graphics*, vol. 21, No. 5, Sep. 10, 1997, pp. 641-653.

(Continued)

*Primary Examiner* — Paul Rodriguez
*Assistant Examiner* — Eunhee Kim
(74) *Attorney, Agent, or Firm* — Finnegan, Henderson, Farabow, Garrett & Dunner, LLP

(57) ABSTRACT

To provide a design support system which can enhance reusability of historical data about past design work and improve work efficiency, design work history data is divided according to an instruction to generate unit work history data, input work made by a person in charge of work in a history is retrieved, input of design support information for the work is accepted, and the input design support information is inserted into the unit work history data to be stored in a database 1. The person in charge of work who reuses the unit work history data performs design work with reference to the design work history data which is previously reproduced in a design support window shown on a display section 24 of a design support device 2 and the design support information contained in it.

20 Claims, 13 Drawing Sheets

OTHER PUBLICATIONS

J.J. Zhang, "Least distorted bump mapping onto surface patches," *Computers and Graphics*, vol. 22, No. 2-3, pp. 233-242, Mar. 6, 1998.

M. M. Oliveira, et al., "Relief Texture Mapping," *Computer Graphics Proceedings., Annual Confrence Series 2000*, SIGGRAPH 2000, New Orleans, Louisiana Jul. 23-28, 2000, pp. 359-368 European Search Report Mar. 16, 2005.

Shah et al., "Database infrastructure for supporting engineering design histories," *Computer-aided Design*, vol. 28, No. 5, pp. 347-360 (1996).

J. G. Gammack et al., "Learning from design histories in concurrent engineering," *Computers in Industry*, 33 (1997) 83-90.

E. Graighill et al, "Process History Capture in a Concurrent Engineering Collaboration Environment," *Enabling Technologies: Infrastructure for Collaborative Enterprises, 1993 Proceedings*, Second Workshop on Morgantown, WV, *IEEE Comput. Soc.*, US Apr. 20, 1993 (pp. 120-127) XP010032770.

Nemetschek: ALLPLAN/ALLPLOT, Version 12, Handbuch Basis, Erweiterung 3 "Variantenkonstruktion," Nov. 1996, Programmsystem GMBH, Munich, Germany XP002301599.

Nemetschek: ALLPLAN Version 12 Handbuch Architektur, Architekturfunktionen Modellieren 3D Makro, Nov. 1996, Nemetschek Programmsystem GMBH, Munchen Germany, XP002301600.

Partial European Search Report dated Jan. 4, 2005.

* cited by examiner

INDICATION OF
DIRECTION OF LINE

INDICATION
OF INPUT
PROCEDURE

INDICATION OF
DIRECTION OF
MOVEMENT

HIGHLIGHT OF
REPRODUCED
PORTION

INDICATION OF
INPUT ORDER AT COMPUTATION

INDICATION OF
SKETCH COORDINATE AXES

INDICATION OF
SKETCH SIZE CONDITIONS

INDICATION OF
SKETCH-CAPTURE ELEMENT

CAPTURE ELEMENT

SUPPORT SYSTEM WITH IMPROVED REUSABILITY OF WORK HISTORY DATA AND DESIGN SUPPORT METHOD

BACKGROUND OF THE INVENTION

1. Field of the Invention

The present invention relates to a design support system such as CAD (computer aided design), and more particularly to an improvement in work efficiency.

2. Description of the Related Art

Recently, CAD generally performs modeling of figures by combining basic figure elements called primitives, or by performing predetermined processing of the primitives as they are, or a combination thereof. Specifically, when one edge of a cube is rounded to have a curved shape, a rounding process of that edge is performed with respect to a cube primitive to create a figure, or the same figure is created by extrusion processing of one quarter of a circle, for example.

As a conventional CAD system, there is known a CAD system which records a history of work contents such as creation, arrangement, processing, etc. of a primitive as work history data and also relates data (figure data) of a figure itself created by the work history data to record and manage as a file, as shown in FIG. 13. According to this CAD system, the work history data can be traced back to change the contents of the past work. For example, histories of design work for parts elements such as a bolt and a nut have their designs and structures made common to some degree and their shapes are simple. They can therefore be readily reused to design another product.

In an actual design situation, a design work of a single product is often conducted separately by a plurality of design teams at the same time in order to speed-up designing. Division of the design work is carefully decided to prevent the design results from individual teams from disagreeing with the designs made by other teams. However, it is difficult to completely eliminate mutually dependency. For example, to design a single vehicle body, a design of its outside body shape (designed surface, which will be hereinafter called a reference surface) and a design of each component part of each body section are separately performed by different teams, but the shapes of the body parts cannot be decided unless the outside body shape is decided because they must conform to the outside body shape.

For example, when the aforementioned conventional CAD system is used to design body parts of a vehicle, their designs and structures are variable depending on design targets, and their shapes are also complex, increasing work history data up to 3000 to 7000 steps. Therefore, it is not realistic to reuse the work history data in view of overhead costs for fetching a required shape from the work history data to know the meaning of work in each step etc. Consequently, design work has to be carried out again from the beginning, and this is very inefficient. It is difficult to reuse certain work history data to actually carry out design unless information such as, for example, directions of drawn line segments, input coordinate values and the like of the work are known even if that work history data is comprised of steps which happen to be reusable.

Meanwhile, when a history of each design work is to be recorded and a shape is represented with reference to a reference surface at a time when the design work is performed, e.g., by designating an offset amount from a temporary reference surface which is used as a standard, a shape conforming to the reference surface, even if it is changed, can be created with ease by reproducing the shape with an offset amount from the changed reference surface. However, if a number of surfaces, a direction of a boundary line or the like, which is referenced between the temporary reference surface and the changed reference surface, is changed, a conforming shape cannot be created properly.

SUMMARY OF THE INVENTION

The present invention was completed in view of the aforementioned circumstances, and, it is an object of the invention to provide a design support system which can improve work efficiency by enhancing reusability of past work history data.

In order to remedy the aforementioned disadvantages, the present invention provides a design support system, comprising a holding device which divides a history of design work for creating a shape model for each part of the shape model and holds a plurality of design work histories as unit work history data; a selection device which fetches at least two unit work history data selected from the plurality of unit work history data held by the holding device; and a combining device which combines the at least two selected unit work history data and outputs design work data for creating a combined shape model which is formed by joining part shape models corresponding to the respective unit work history data.

In order to remedy the aforementioned disadvantages, the present invention also provides a design support system which outputs work data for creating a shape model of a design target in order to create the shape model of the design target conforming to a standard shape, comprising a holding device which holds a plurality of unit work history data which are obtained by dividing a history of design work performed with reference to a first standard shape for each design work history corresponding to a shape model of a predetermined portion; a receiving device which accepts designation of data about a second standard shape; a selecting device which fetches multiple unit work history data selected from the multiple unit work history data held by the holding device; and an output device which combines each of the fetched unit work history data, reproduces design work with reference to the designated second standard shape for the design works performed with reference to the first standard shape among the design work contained in the unit work history data, and outputs work data corresponding to a combined shape model conforming to the second standard shape.

It is also preferable to additionally have a device which computes at least one technical characteristic value of a combined shape model which is created from the output work data.

It is also suitable for the holding device to accumulate technical conditions, which shall be met by a part shape model to be created according to each unit work history data, in association with each unit work history data; and there is further provided a device which compares the computed technical characteristic value with the technical conditions related to unit work history data which is the origin of the work data, so as to provide the compared results to predetermined design processing.

It is also preferable to additionally have a device which receives designation of data about a third standard shape; and the work data is converted by reproducing design work with reference to the designated third standard shape for work which is included in the work contained in the output work data and performed with reference to the second standard shape, and conversion work data corresponding to a shape model conforming to the third standard shape is output.

It is also preferable to further include a device which analyzes a history of design work and extracts input work made by a person in charge of work when unit history data is created; a device which shows the extracted input work to the person in charge of work to receive input of design support information; and a device which records the design support information in a history of the design work and divides into unit history data when the design support information is input, so as to show when the design support information is reused.

In order to remedy the aforementioned disadvantages, the present invention also provides a design support system which holds a series of design work histories to reuse as work history data and creates a shape based on the work history data, comprising a device which analyzes the work history data to extract input work made by a person in charge of work; a device which shows the extracted input work to the person in charge of work to receive input of design support information; and a device which records the design support information in the work history data when the design support information is input so as to show when the design support information is reused. Thus, an operator reusing the design support information can be provided with the design support information describing meanings of the respective work etc., and reusability and work efficiency are improved.

It is preferable to further provide the design support system with a device which generates unit work history data by dividing the work history data into predetermined work units for each design target. Thus, the work history data can be registered as predetermined divided elements and, for example, reuse of the work history data on side portions only is promoted.

In order to remedy the aforementioned disadvantages, the present invention also provides a design support system, comprising a device which accumulates unit work history data which is formed by dividing a history of past design work into work units determined for each design target and contains design support information related to input work among the design work; a device which selectively shows the unit work history upon receiving designation of the design target; a device which creates a shape by sequentially reproducing the selected unit work history; and a device which provides design support information related to input work when the input work is demanded while the unit work history is being reproduced.

It is also preferable that the design support system is further provided with a device which judges whether the work history to be reproduced agrees with predetermined guide display conditions while the unit work history is being reproduced; and a device which performs a guide display determined in connection with the guide display conditions if the work history agrees with the guide display conditions.

Besides, in order to remedy the aforementioned disadvantages, the present invention also provides a design support system, comprising a device which accumulates unit work history data which is formed by dividing a history of past design work into work units determined for each design target and contains design support information related to input work among the design work; a first display device which shows a shape of a design target obtained by sequentially reproducing a history of the design work with reference to the unit work history data; and a second display device which shows design support information contained in the unit work history data by reproducing a history of a design work ahead of the reproducing state by the first display device.

Besides, in order to remedy the aforementioned disadvantages, the present invention also provides a design support method which holds a series of design work histories as work history data for reuse and creates a shape based on the work history data, comprising the steps of analyzing the work history data to extract input work carried out by a person in charge of work, showing the extracted input work to the person in charge of work to receive input of design support information, and recording the design support information in the work history data when the design support information is input so as to show when the design support information is reused.

In order to remedy the aforementioned disadvantages, the present invention also provides a design support method, comprising the steps of accumulating unit work history data which is formed by dividing a history of past design work into work units determined for each design target and contains design support information related to input work among the design work; selectively showing the unit work history upon receiving designation of the design target; creating a shape by sequentially reproducing the selected unit work history; and providing design support information related to input work when the input work is demanded while the unit work history is being reproduced.

It is also preferable for this design support method to judge whether the work history to be reproduced agrees with predetermined guide display conditions while the unit work history is being reproduced and to perform a guidance display determined in connection with the guidance display conditions if the work history agrees with the guidance display conditions.

In order to remedy the aforementioned disadvantages, the present invention also provides a design support method using a computer, wherein a series of design work histories are held in multiple quantities as work history data in a database in order to create a part shape model; at least two selected work history data are fetched from the held multiple work history data according to an instruction input to a processor; and design work data for creating a one-piece shape model by combining the at least two fetched work history data and connecting part shape models corresponding to the respective work history data is output.

In order to remedy the aforementioned disadvantages, the present invention also provides a design support method which uses a computer to create a shape model of a design target conforming to a desired standard shape according to input to its processor and outputs work data for creating the shape model of the design target, comprising the steps of holding a plurality of histories of design work performed in the past with reference to the respective standard shapes in a database as work history data; accepting designation of data about a second standard shape, which is a desired standard shape, according to an instruction input to the processor; fetching the selected multiple work history data from the multiple work history data held in the database; and combining respective pieces of the fetched work history data, reproducing design work with reference to the designated second standard shape for the design work performed in the past with reference to the respective standard shapes among the design works contained in the work history data, and outputting work data corresponding to a combined shape model conforming to the second standard shape. The respective design work histories subject to combination may be made with reference to different standard shapes (different first standard shapes).

In order to remedy the aforementioned disadvantages, the present invention also provides a design support method which holds a series of design work histories as work history data for reuse and generates a shape by a computer according to the work history data according to an instruction input to a processor, comprising the steps of analyzing the work history data upon input to the processor to extract the input work performed by a person in charge of work; showing the extracted input work to the person in charge of work to receive input of design support information and, when the design support information is input, recording the design support information in the work history data so as to show it at reuse.

In order to remedy the aforementioned disadvantages, the present invention also provides a design support method, comprising the steps of accumulating, by a computer, unit work history data which is formed by dividing a history of past design work into work units determined for each design target and contains design support information related to an input work among the design work; showing the unit work history selectively upon receiving designation of a design target by the computer; creating a shape by sequentially reproducing the selected unit work history; and providing the design support information related to input work when the input work is demanded while the unit work history is being reproduced.

Here, it is preferable that it is judged whether the work history to be reproduced conforms to predetermined guidance display conditions while the unit work history data is being reproduced by the computer and, if it conforms to the guidance display conditions, a guidance display determined in connection with the guide display conditions is performed.

DESCRIPTION OF THE PREFERRED EMBODIMENT

Figure 1:
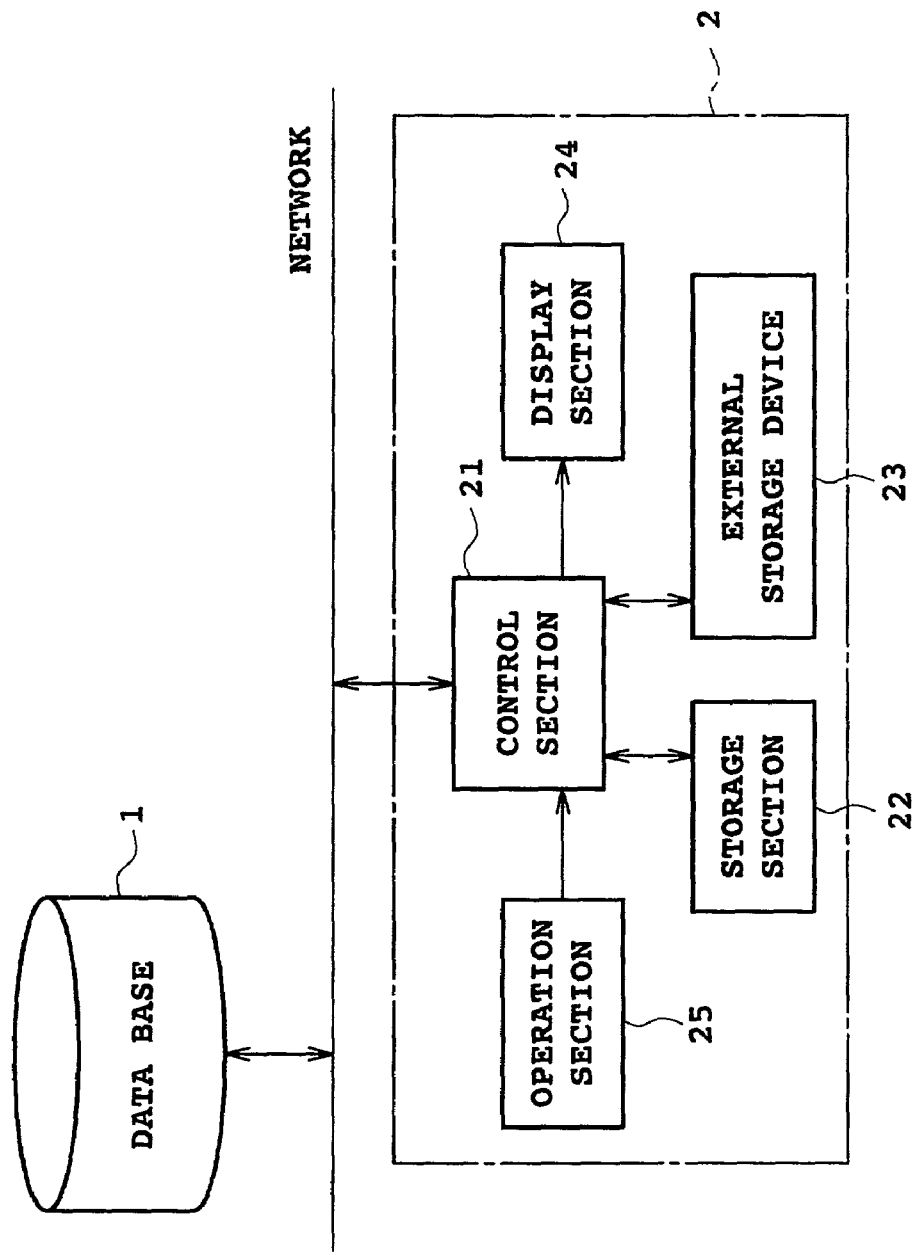
FIG. 1 is a structural block diagram of a design support system according to an embodiment of the present invention.

An embodiment of the present invention will be described with reference to the accompanying drawings. The design support system according to the embodiment of the present invention is comprised of a database 1 as means for accumulating work history data and a design support device 2 as shown in FIG. 1. The design support device 2 is basically configured of a control section 21 (processor), a storage section 22, an external storage device 23, a display section 24 and an operation section 25. The database 1 and the design support device 2 are mutually connected over a network or the like.

The database 1 holds records of the past design work performed by the design support device 2 as design work history data. This embodiment has a feature that the design work history data held by the database 1 is divided and registered for each work unit which is previously determined for each design target. The work unit will be hereinafter called unit work history data. For example, body parts of a vehicle are previously determined to have units such as a "side" a "rib" and the like, and the design work history data is divided for each data about such parts and registered as unit design work history data in the database 1.

Figure 2:
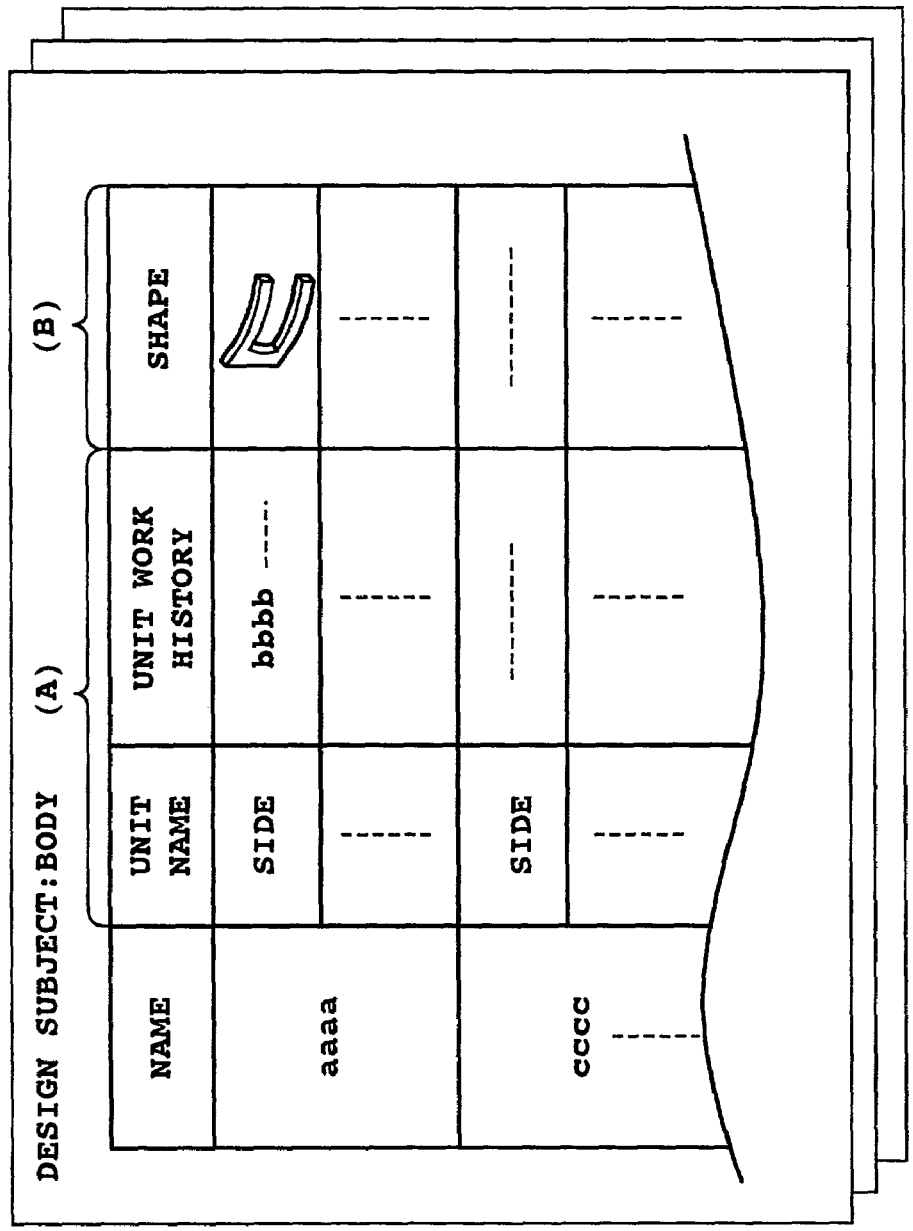
FIG. 2 is an explanatory diagram showing an example of work history data accumulated in a database 1.

Specifically, this database 1 has a history of the past design work for each design target divided into a unit work history and registered together with its name (A) as shown in FIG. 2. It is also desirable that a shape resulting from the execution of the unit work history is also registered (B).

Another feature of this embodiment is that the unit work history data includes design support information determined by a person in charge of work. Setting of the design support information will be described in conjunction with the operation of the control section 21 later.

The control section 21 of the design support device 2 basically performs processing (design processing) corresponding to the design work and processing (edit processing) for editing the contents of the design work. Such processing will be described in detail later. The storage section 22 is a hard disk or the like and stores programs for design processing and edit processing executed by the control section 21. The external storage device 23 reads a program from a storage medium such as CD-ROM or DVD and outputs to the control section 21. The read program is installed in the storage section 22 by the control section 21. The display section 24 is a display or the like which displays according to an instruction from the control section 21. The operation section 25 is a mouse, a keyboard or the like which outputs the contents operated by the person in charge of work to the control section 21.

[Processing by Control Section]

Here, design processing and edit processing by the control section 21 will be described specifically. In the design processing, the control section 21 shows a window screen for designing (main window) and performs the same design work as conventional parametric CAD does. The contents of the design work are registered as work history data in the database 1.

[Edit Processing]

Figure 3:
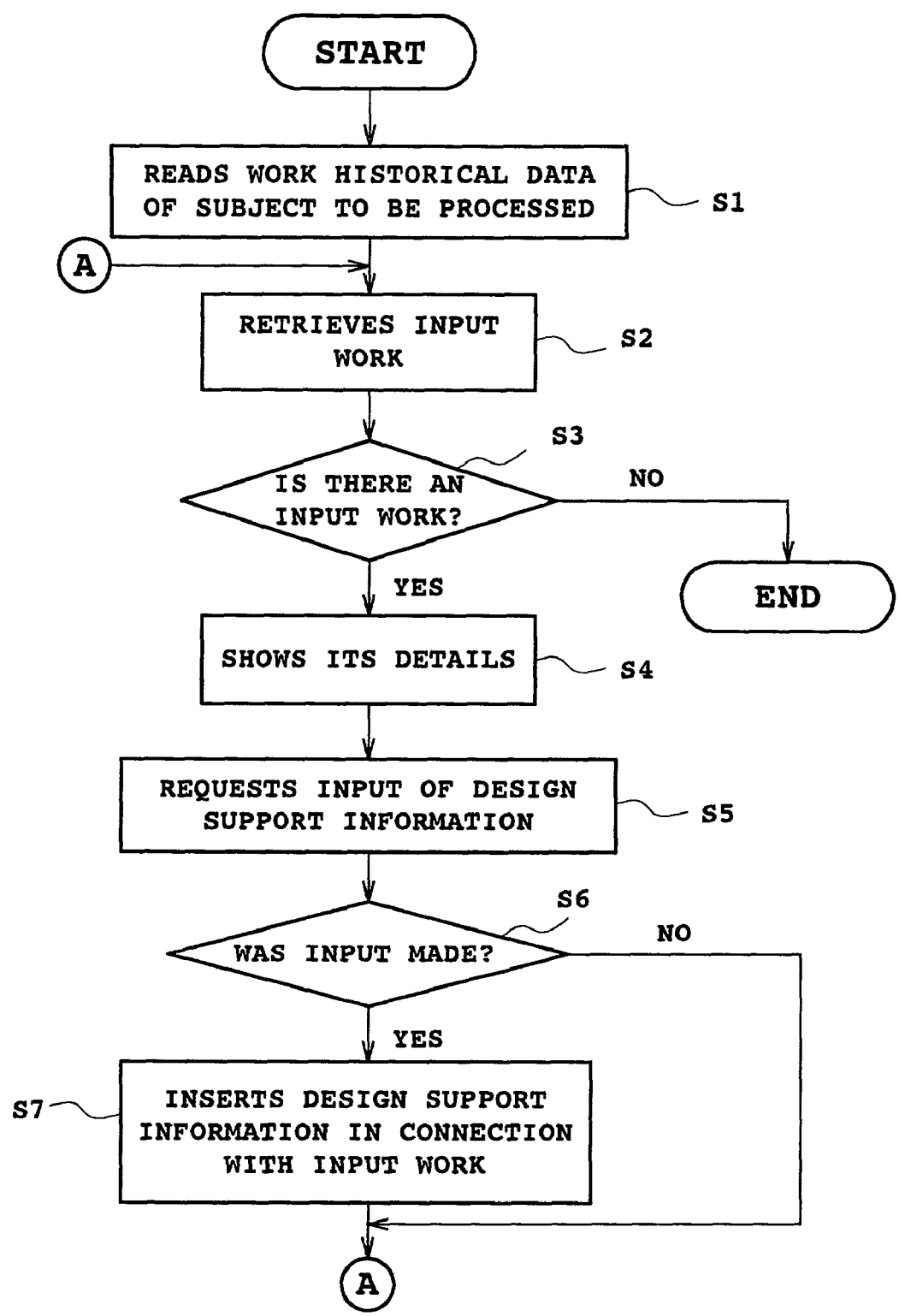
FIG. 3 is a flowchart showing an example of an editing process.

The control section 21 starts analyzing the registered work history data according to an instruction by the person in charge of work and starts the edit processing shown in FIG. 3. The control section 21 reads the work history data subject to the processing (S1) and retrieves input work by the person in charge of work from the work history data (S2). The input work includes, for example, the designation of a primitive, the input of coordinate values, the instructions for a computation (instructions for the sum (combination) of a primitive A and a primitive B, their difference (clipping) or their product (taking out of a multiple part)), and their order (whether B is subtracted from A or A is subtracted from B).

The control section 21 judges whether the input work is found by searching (S3), and if it is found (if Yes), highlights the contents of the input work on the display section 24 (S4), and requests the person in charge of work to input design support information such as a comment and a meaning of the work (S5). When the design support information is input or no input thereof is instructed, it is judged which one is made (S6), and if the design support information is input (an input is made), the input information is inserted in connection with the input work into the work history data (S7), and the procedure returns to the step S2 to continue processing. If the design support information is not input in the step S6 (no input), the procedure returns to the step S2 to continue processing.

Furthermore, if no additional input work is found by searching in the step S3 (when the steps S4 to S7 are completed for all the input work), the work history data after the processing is registered in the database 1, and the procedure is terminated.

Here, the highlighting in the step S4 is animated for example by alternately displaying the shapes before and after the work or by indicating a work command. The edit processing, means and procedures for extraction of the input work of the present invention, reception of the input of the design support information and recording in the work history data, are realized by software.

[Creation of Unit Work History Data]

The control section 21 extracts data ranging from a first position to a second position designated in the work history data, stores it with a name added thereto, and registers as unit work history data in the database 1. Thus, means and procedures for generating unit work history data are realized.

Specifically, a procedure to design an L-shaped member, to divide it, and to generate unit work history data will be described. First, when the L-shaped member is designed, two sides configuring the L-shaped member can be separately designed and then put together. In other words, a first sectional shape is created, the created first sectional shape is extruded by a designing operation to create a pillar shape (a first side), a second sectional shape is separately created so as to cross at right angles with the first side, and the created second sectional shape is extruded by a designing operation to create another pillar shape (a second side). Thus, the first and second sides are created and put together to design the L-shaped member. Here, if the first sectional shape and the second sectional shape are different, both the sectional shapes are interpolated to form a joint part (joint block).

The design work history of the L-shaped member designed as described above is divided to create unit work history data. Division can be made into any unit, e.g., the first side, the second side and the joint block.

The control section 21 receives from the person in charge of work the operation to fetch the data ranging from the instruction to create the first sectional shape (first position) to the instruction to create the pillar shape by extruding the first sectional shape as the unit work history data in the work history, inquires the person in charge of work about a name to be given to the fetched unit work history data, receives the input of the name, and registers the previously fetched unit work history data with the name into the database 1.

It is then determined that an instruction to create the second sectional shape is a first position and the instruction to create the second shape by extruding the first position is a second position, and unit work history data is fetched and registered in the database 1 in the same way as above. This embodiment has a feature that the instruction to create the joint block extending from the first sectional shape to the second sectional shape can also be recorded as unit work history data in the database 1.

The first sectional shape and its extrusion and the second sectional shape and its extrusion may be instructed as an offset value or the like from a predetermined design surface. In other words, individual corners of the sectional shape, the extruding direction, the extruding volume, etc. may be designated based on the coordinate values of surface elements forming a separately designated design surface. Each instruction may be made including conditions (design requirements) such as size values necessary for the pertinent design part to exhibit necessary performance, conditions (production technology requirements) of values necessary for processing the pertinent part, etc. Interpolation processing is made according to an interpolation parameter instructed by the person in charge of work, and the joint block has a shape which is slightly different depending on the interpolation parameter.

The unit work history data registered in the database 1 as described above is used for actual designing.

[Design Processing]

Figure 4:
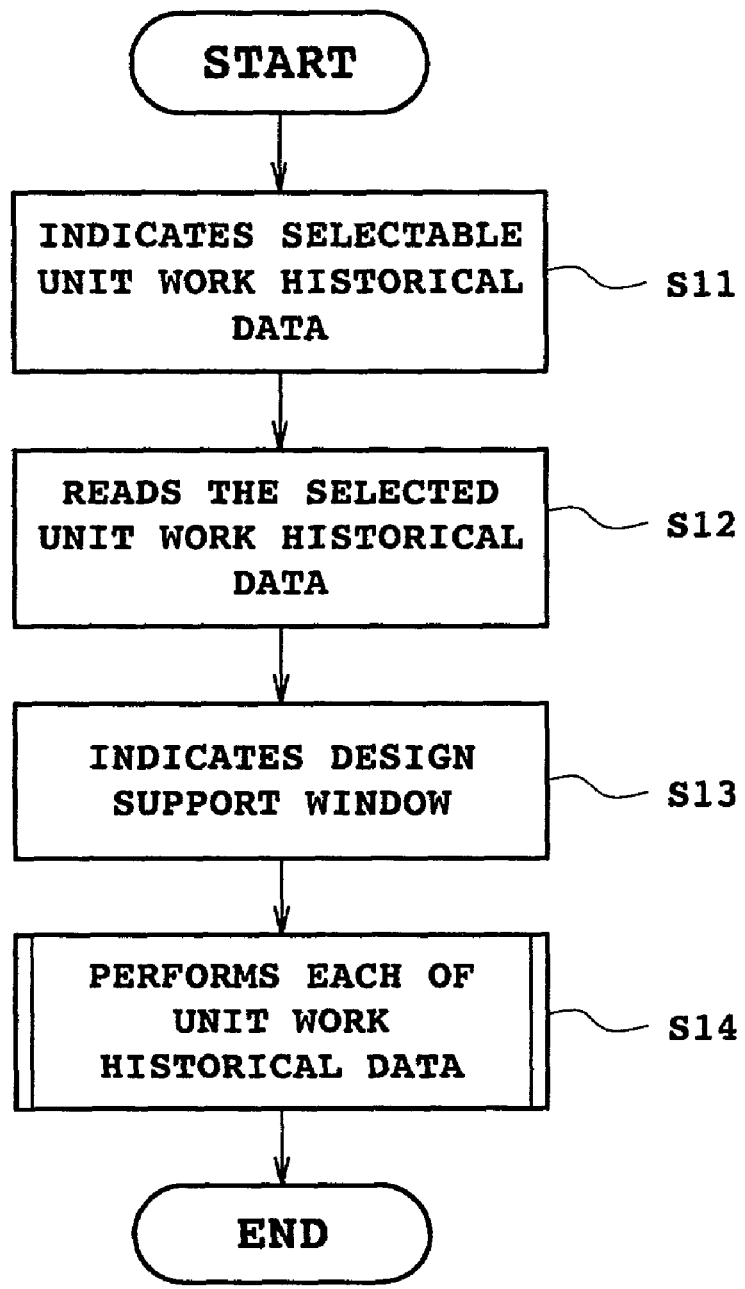
FIG. 4 is a flow chart showing an example of a designing process.
Figure 5A:
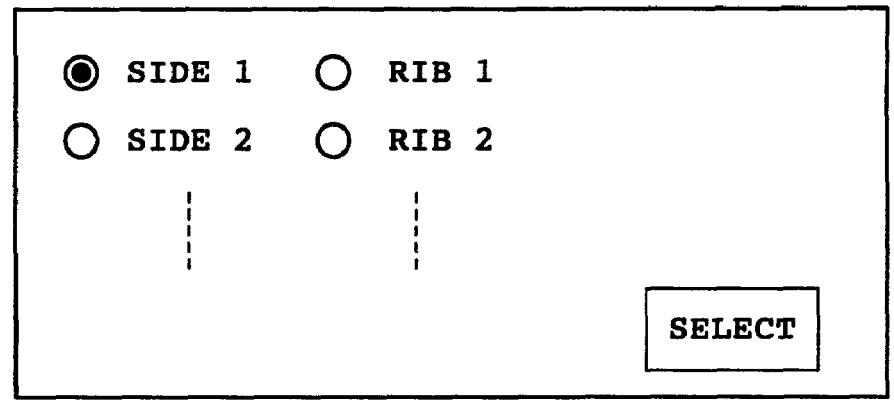
FIGS. 5A and 5B are explanatory diagrams showing example selection screens.
Figure 5B:
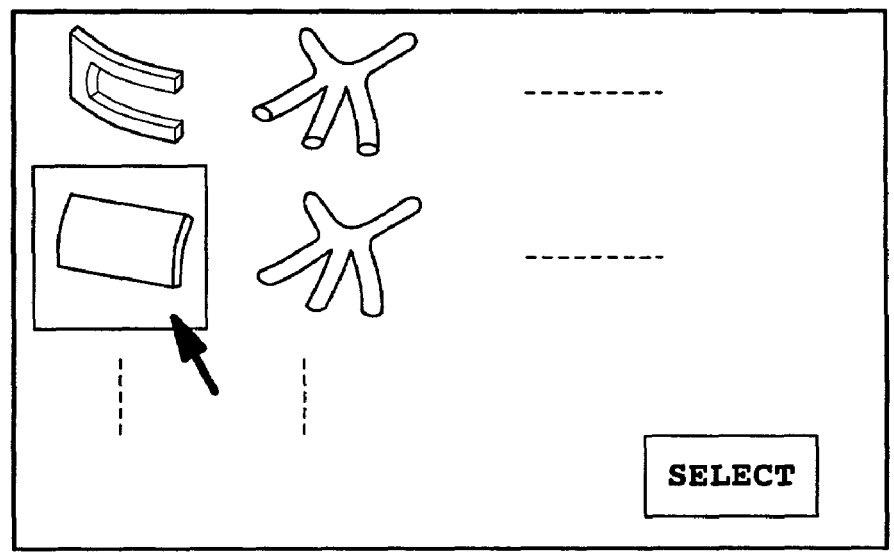

Design processing by the control section 21 of the design support device 2 of this embodiment will now be described. The design processing works to support the process to fetch the contents of the past design work for reuse. Specifically, the control section 21 receives the input of the instruction to read the unit work history data from the database 1, starts the processing shown in FIG. 4, reads a name (or a shape obtained by it) of the unit work history data related to the design target to be designed now, and performs selective display on the display section 24 (S11). This displaying embodiment may show a list of names as shown in FIG. 5A or preferably may show a list of shapes as shown in FIG. 5B. Here, when one of the unit work history data is selected by manipulating the mouse of the operation section 25, the control section 21 reads the unit work history data from the database 1 (S12), shows the design support window (S13), processes to sequentially execute the unit work history data one by one (S14) and terminates the processing after completing the execution. Thus, the database 1 having accumulated a plurality of unit work history data can be a "shelf" for the unit work history data, and the person in charge of work can fetch the unit work history data from the "shelf" to use it for designing.

Figure 6:
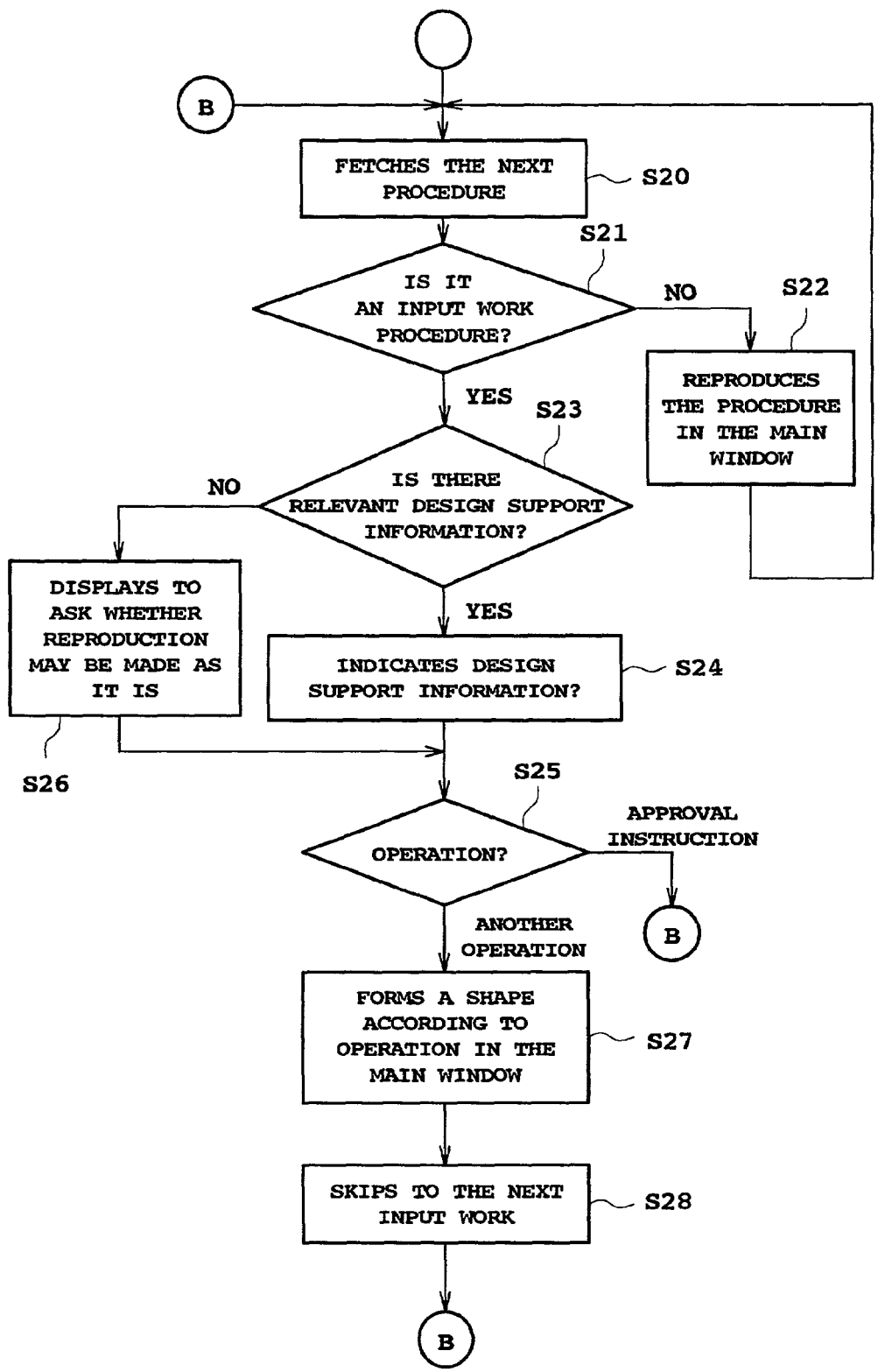
FIG. 6 is a flow chart partly showing an example of an editing process.

Here, the step S14 for sequentially executing the unit work history data fetches the next single work procedure of the read unit work history data as shown in FIG. 6 (S20) and checks whether it is input work or not (S21). This input work includes, for example, instructions for designation of a primitive, input of coordinate values, a computation instruction, etc. If it is not input work (if No), the work is reproduced in the main window (S22) (i.e., a shape is created), and the procedure returns back to the step S20 to continue the processing.

Meanwhile, if the work procedure fetched in the step S21 is input work (if Yes), it is judged whether there is design support information related to it (S23), and if there is design support information (if Yes), it is shown on the design support window (S24), and an operation is awaited (S25). When the operation executed in the step S25 is an instruction to execute the unit work history data as it is (approval instruction), the procedure returns to the step S20 to continue the processing (B). However, if there is no design support information in the step S23 (if No), display is carried out to ask the person in charge of work whether the work procedure fetched in the step S20 may be executed as it is (S26), and the procedure moves to the step S25.

When the operation executed in the step S25 is different from an operation for the unit work history data (another operation), the operation for the shape in the main window is executed accordingly (S27), the next input work is retrieved (namely, the present input work is skipped) (S28), the procedure returns back to the step S20, and the processing is continued from the retrieved input work. If the next work is not in the step S20 or the next input work cannot be retrieved in the step S28, the processing is terminated.

Here, when a display is made in the steps S24 and S26 and the work procedure fetched in the step S20 is executed, it is preferable to show in the design support window what shape is formed as a result. This is performed by reproducing the procedure until a command for the next input work in the design support window. In other words, the display in the design work window takes precedence and is also synchronized with the designing situation being performed in the main window, and even if a work procedure different from the one for the unit work history data being reused for the work shape on the way is performed, synchronization can be made again from the next input work. Here, it is configured that when an operation different from the one for the unit work history data is executed, a corresponding operation is skipped (step S28). However, it may be configured to ask the person in charge of work whether this skipping operation shall be skipped or not, and the step S28 is executed only when it is instructed to skip it, but if not, the procedure may be repeated from the step S23.

[Support Information not Depending on Input by Person in Charge of Work]

Figure 7A:
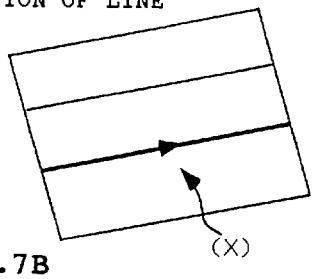
FIGS. 7A, 7B, 7C, 7D, 7E, 7F, 7G, and 7H are explanatory diagrams showing an example of a guidance display.
Figure 7B:
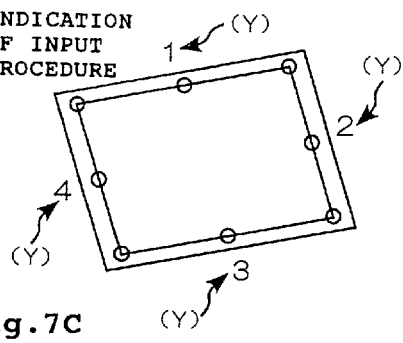
Figure 7C:
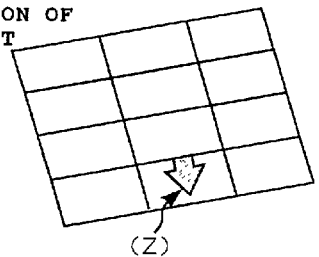
Figure 7D:
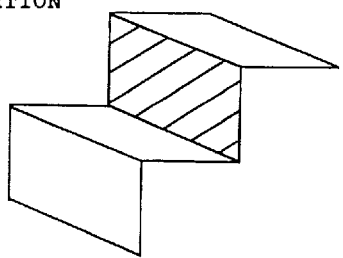
Figure 7E:
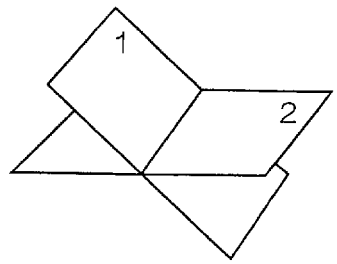
Figure 7F:
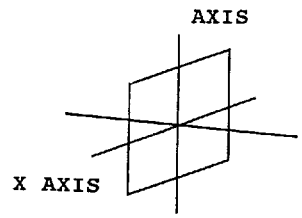
Figure 7G:
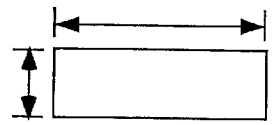
Figure 7H:
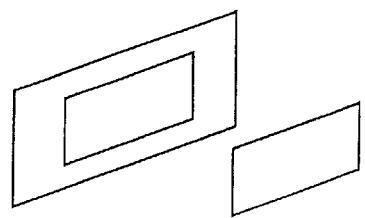

In the aforementioned description, design support information which is provided in accordance with the display effected in the step S24 or S26 is previously determined by a creator (or editor) of the unit work history data being reproduced. However, it is also preferable that a guide display condition related to information indicating the display mode is accumulated in the storage section 22 for a command indicating a particular operation, such as an input operation of line segments, an input operation to determine a single shape by a plurality of steps, an operation to move a given shape or the like, it is judged whether the command related to the work history being reproduced agrees with the guide display condition, and if it agrees, a predetermined guide display is made within the design support window according to the information about the display mode related to the command. For example, this guide display is effected by the embodiment as shown in FIG. 7. Specifically, when the input operation of a line segment is performed, the arrow (X) indicating a direction of the line segment is highlighted (FIG. 7A), and if input of many steps is required, numerals indicating an input order are shown (Y) in the proximity of the shape determined by each input (FIG. 7B). Besides, a moving direction of the figure is indicated by the arrow (Z) (FIG. 7C). Highlight of the reproduced section (FIG. 7D) and an input order of the shape elements at computing (FIG. 7E) are also shown.

When a shape (sketch) which is not created through a series of steps, but only defined by entering dimensions, is contained in the work history, an indication of the coordinate axes used to define the shape (FIG. 7F), an indication of size conditions (constraint conditions) (FIG. 7G) and an indication of the fetched sketch element (FIG. 7H), are given as the guide indications.

The input order of the shape elements at the time of computing is determined so as to prevent creation of a different shape element. For example, when a new shape element is created by subtracting a subsequent input shape element (subsequent shape element) from a previous input shape element (previous shape element), an erroneous reverse subtraction, namely the subtraction of the previous shape element from the subsequent shape element, can be prevented.

Thus, first display means of the present invention are realized by the above processing to show the main window, and second display means of the invention are realized by the processing to show the design support window.

[Reproduction Based on the Designated Reference Surface]

In the design processing by the control section 21, the unit work history data is based on the reference surface (original reference surface (a first standard shape of the present invention)) used for the past designing, and, for example, the work history may be configured using an offset value from the reference surface. Thus, it is possible to design while conforming to a specific reference surface as the shape elements (points, line segments, surfaces, etc.) to be a standard specify other shape elements (namely, the other shape elements refer to data on the shape elements to be standards). The unit work history data may be created using design work based on a different reference surface. In other words, there may be more than one first standard shape.

In this case, a reference surface to which the design content shall conform is designated in advance of the design processing, and an offset value or the like included in the work history is used with reference to the designated reference surface (second standard shape of the invention) in the reproduction of the procedure shown in FIG. 6 (step S22).

Here, the reference surface is generally designed by combining shape elements having a plurality of surfaces, and upon receiving the designation about which surface (or which surface group) is used as a standard for the reproduction procedure, the work history is reproduced based on the surface shape designated as the standard. Thus, a member conforming to the designated reference surface can be designed according to the past design history.

For the results of designing the member conforming to the designated reference surface, the control section 21 analyzes a strength according to a method such as a finite element method, computes a value (technical characteristic value) indicating technical characteristics, and shows the results to the person in charge of work.

[Use of Design Requirements and Production Technology Requirements]

The technical characteristic value is compared with the design requirement and production technology requirement contained in the work history, and the results are shown to the person in charge of work. Thus, the person in charge of work is provided with the results of evaluating the design contents as required to know a change in the technical characteristic values involved in the shape change (edit of the design history) etc., and can readily design while keeping the technical characteristic values at an appropriate level.

[Combination of at Least Two Unit Work History Data]

The person in charge of work can also create a single combined shape by combining at least two unit work history data fetched by design processing. For example, a first unit work history which is a work history for designing a side portion and a second unit work history which is a work history of designing a rib portion are fetched, and it is instructed to connect the side portion and the rib portion at their designated ends. This instruction may be an instruction to interpolate by designating a new interpolation parameter for the shapes of the ends to be joined or an instruction to join by fetching a joint block registered as unit work history data in the database 1 and using an interpolation parameter included as the joint block. According to the latter, the past design history can be used to simplify the design work.

The combined shape is created according to the history of a series of work procedures for combining a plurality of unit work data. It is also desirable to make the series of work procedures after the combination executable sequentially one by one. In this case, the next single work procedure is sequentially fetched from the series of work procedures obtained by combining, and the same procedure as the one shown in FIG. 6 is executed. Specifically, it is checked whether the fetched procedure is input work (instructions such as designation of a primitive, input of coordinate values, a computation instruction, etc.), and if it is not input work, the work is reproduced in the main window (namely, a shape is created), while if it is input work, it is judged whether there is design support information which is linked to the input work, and if there is design support information, the design support information is shown on the design support window, and an operation is awaited. Also, if there is no design support information, the person in charge of work is asked whether the work procedure may be executed as it is, and an operation is waited for.

Here, the person in charge of work inputs an instruction (approval instruction) to execute as it is or performs a different operation (another operation). When the approval instruction is input, the work data is executed as it is, the procedure returns to a step to fetch the next procedure, and the processing is continued.

When another operation is performed, the shape shown in the main window is operated according to the operation, the next input work is retrieved (namely, the present input work is skipped), the retrieved input work is fetched, and the processing is continued. If the next work is not present or the next input work cannot be retrieved, the processing is terminated.

According to this embodiment, for the history of a series of work procedures obtained as a result of combining the unit work history data, the procedure is sequentially reproduced and the design support information is provided without causing the person in charge of work to notice the joint (combined point) of the respective pieces of unit historical data.

[Basic Operation]

A basic operation of the design support system of this embodiment will now be described. A plurality of histories of past design works are accumulated for the respective design targets as unit work history data in the database 1. The person in charge of work who designs a new product inputs the design target and design information to the design support device 2 to show the unit work history data linked to the design target on the display section 24. Here, when the person in charge of work selects one piece of data from the unit work history data shown on the display section 24, the design support window is shown, and the reproduction of the selected unit work history data is started.

When the person in charge of work refers to the shape to be reproduced in advance in the design support window to use as it is, the reproduction is approved, and when a change or addition is made, a design operation is performed instead of a part of the work history or in addition to the work history.

When there is information (information about designation of a primitive, input of coordinate values and the like) to be input by the person in charge of work in the reproduction process and when design support information is contained in the unit work history data the design support device 2 of this embodiment displays the design support information. Besides, when there is a guide display corresponding to a predetermined command, the guide display is performed.

The person in charge of work can see the design support information to know information such as a meaning of each input work and can also know more detailed information about the contents of work from the guide display. Thus, reuse of the work history data is promoted, and design work efficiency is improved.

Besides, for the historical data about the design work obtained as above, the input work contained in it is retrieved in this embodiment, and an interface for requesting each input work to input design support information is provided. Thus, the person in charge of work is saved from inputting the design support information.

[Operation to Design Based on Reference Surface]

An operation to design according to the reference surface by the design support system of this embodiment will now be described. A plurality of histories of past design works are accumulated in the database 1 as unit work history data for each design target. The accumulated unit work history data are designed on the basis of the reference surface (original reference surface) used for the past design works.

The person in charge of work who designs a new member conforming to a new reference surface inputs information about the new reference surface to the design support device 2. Then, the design support device 2 reproduces work history data based on the new reference surface.

When the person in charge of work inputs the design target and the design, unit work history data linked to the design target is shown on the display section 24. When the person in charge of work operates to select one piece of data from the displayed unit work history data, the design support window is shown, and the reproduction of the selected unit work history data is started. When reproducing, the work performed with the original reference surface used as a standard is reproduced with the newly designated reference surface used as a standard.

Figure 8A:
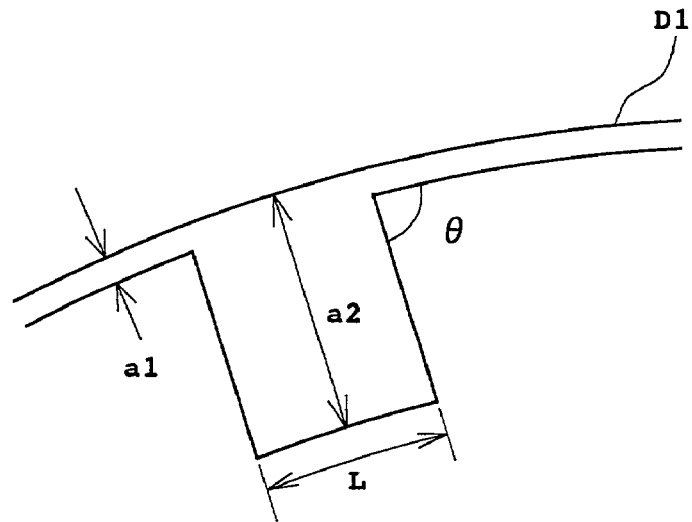
FIG. 8A is an explanatory diagram showing a relationship between a reference surface and work history data.

Specifically, when the selected unit work history data is created by an operation using offset values (a1, a2, ... ) with the original reference surface (D1) used as a standard and having a recessed shape on a plate along the reference surface as shown in FIG. 8A, a minimum value is determined for a width L of the recess section as a design requirement with respect to the unit work history data, and minimum and maximum values are determined for an angle θ which is formed by the inside wall of the recess section and the plate parallel to the reference surface. To make it easier to understand, FIG. 8A shows the reference surface which is cut away at a certain portion.

Figure 8B:
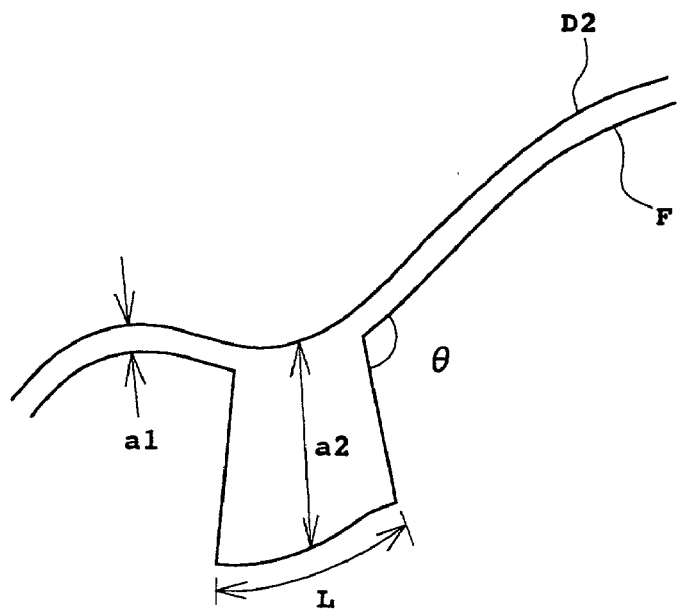
FIG. 8B is an explanatory diagram showing a relationship between a reference surface and work history data.

When the reference surface (D2) shown in FIG. 8B is newly designated on the basis of the unit work history data of FIG. 8A, the offset values (a1, a2, ... ) are reproduced, and a shape F having a recess section is designed with the reference surface D2 used as a standard.

When the person in charge of work references the shape F which is reproduced in advance in the design support window and uses it as it is, the reproduction is approved, and when a change or addition is made, a design operation is performed instead of a part of the work history or in addition thereto.

Also, when there is information (information about designation of a primitive, input of coordinate values, etc.) to be input by the person in charge of work in the reproduction process and design support information is contained in the unit work history data, the design support device 2 of this embodiment shows that information. Besides, when there is a guide display corresponding to the predetermined command, the design support device 2 performs the guide display.

Here, when the person in charge of work instructs to evaluate, technical characteristic values are computed by the finite element method or the like, the technical characteristic values are compared with the design requirements and the production technology requirements, and the results are shown to the person in charge of work.

The person in charge of work can know information such as meanings of respective input work by seeing the design support information and the computed results of the technical characteristic values and also can know more detailed information about the contents of the work from the guide display.

Besides, an appropriate design is made according to the computed results of the technical characteristic values. Thus, reuse of the work history data is promoted, and efficiency of the design work is improved.

[Conversion into Formal Design]

As described above, the reference surface may be designed in parallel with the designing of a member which shall be made to conform to the reference surface. In this case, when the member is designed based on a temporary reference surface and a finally determined reference surface (formal reference surface) is completely designed, the design history which is previously performed based on the temporary reference surface (corresponding to the second standard shape of the present invention) is converted into a design history based on the formal reference surface, and a member conforming to the formal reference surface (corresponding to the third standard shape of the present invention) is designed.

Figure 9:
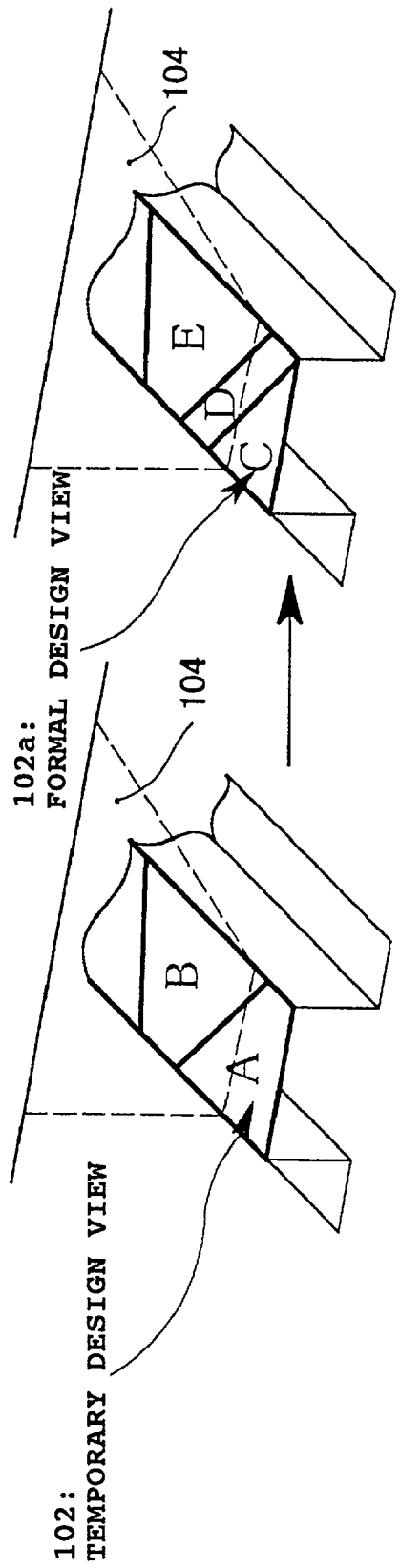
FIG. 9 is an explanatory diagram showing an example of an error situation caused when a design is replaced.

At this time, the following technical problems might arise. Specifically, they are an error (1) involved in a change of the number of configuring surfaces, an error (2) resulting from a change in direction or quantity of border lines, an error (3) involved in reversing of the direction of a surface, and an error (4) due to folding of a surface. As shown in FIG. 9, the error (1) involved in a change of the number of configuring surfaces means that when there is a surface 104, which is designed based on given surface elements A, B on a temporary reference surface 102 and conditioned to come into contact with the temporary reference surface 102, and a reference surface 102a corresponding to the temporary reference surface 102 consists of three surface elements C, D, E, it is not certain to which of the surfaces C, D, E the standard surface to be referenced corresponds, and the system cannot make a judgment.

Also, the error (2) resulting from a change in direction or a number of border lines is derived from the fact that a surface is indicated by a single loop specifying a border line. Depending on whether the loop is clockwise or counterclockwise, e.g., when it is clockwise for the temporary design but becomes counterclockwise for the formal design, a created shape is different from an intended one due to the results of the work performed based on the border line. Besides, the error (3) involved in reversing of the direction of a surface means that a shape specified in a "positive direction" (e.g., when a right-hand screw is turned in the direction of a loop specifying the surface, the forwarding direction of the screw is determined as positive) with respect to a certain surface is occasionally generated. This type of work results in a formed shape different from the intended shape when the surface direction is reversed.

Here, each surface element is internally generated by a CAD system, and the direction of a corresponding surface might be reversed between the temporary design surface and the formal design surface before the designer of the reference surface knows it.

Besides, the error (4) due to folding of a surface means an error caused when a plurality of surface elements which are smoothly connected for the temporary design are not smoothly connected for the formal design. Specifically, when a line is projected to a given curved surface to form a shape by cutting the surface by the projected line, other work may be conducted with reference to the projected line. At this time, the projected line selected from a group of smoothly connected surface elements forms a single smooth curve, so that other work conducted with reference to it corresponds to the single curve. However, when a group of surfaces corresponding to the projected line are not connected smoothly, the projected line becomes a zigzag line, which is formed of a plurality of line segments. Therefore, the work performed with reference to a single curve cannot specify a projected line to be referenced and has an error.

Under the aforementioned circumstances, design support information may be shown in the same way as designing performed with unit work history data combined. However, because the temporary design and the formal design are not that different from each other, the surface groups can be made to correspond mutually between the surface elements contained in the temporary design and the surface elements contained in the formal design. Therefore, the generating of correspondence is performed prior to the reproduction of the procedure based on the formal design. Specifically, this generation of correspondence is performed as the person in charge of work shows the temporary reference surface and the formal reference surface to determine a surface group for both of them and allots an ID to them. Also, a corresponding surface group is designated. Thus, the corresponding surface groups are determined and IDs of the corresponding surface groups are registered as a pair. By generating correspondence as described above, it can be judged whether a direction of the loop specifying the corresponding surface is changed or not, and a direction of the surface can also be judged. Therefore, the aforementioned problems (1) to (3) can be solved by previously generating correspondence.

Also, when a connected relation of the surface elements contained in the associated individual surface groups (the surface group of the temporary design and that of the formal design) is checked, and if one of them is smoothly connected while the other is not, this is notified to the person in charge of work to cause them to edit the design work of the member, to prevent a design surface from being folded or the like, thereby making it possible to prevent the error (4) from occurring.

[Execution of Overall Work]

Figure 10:
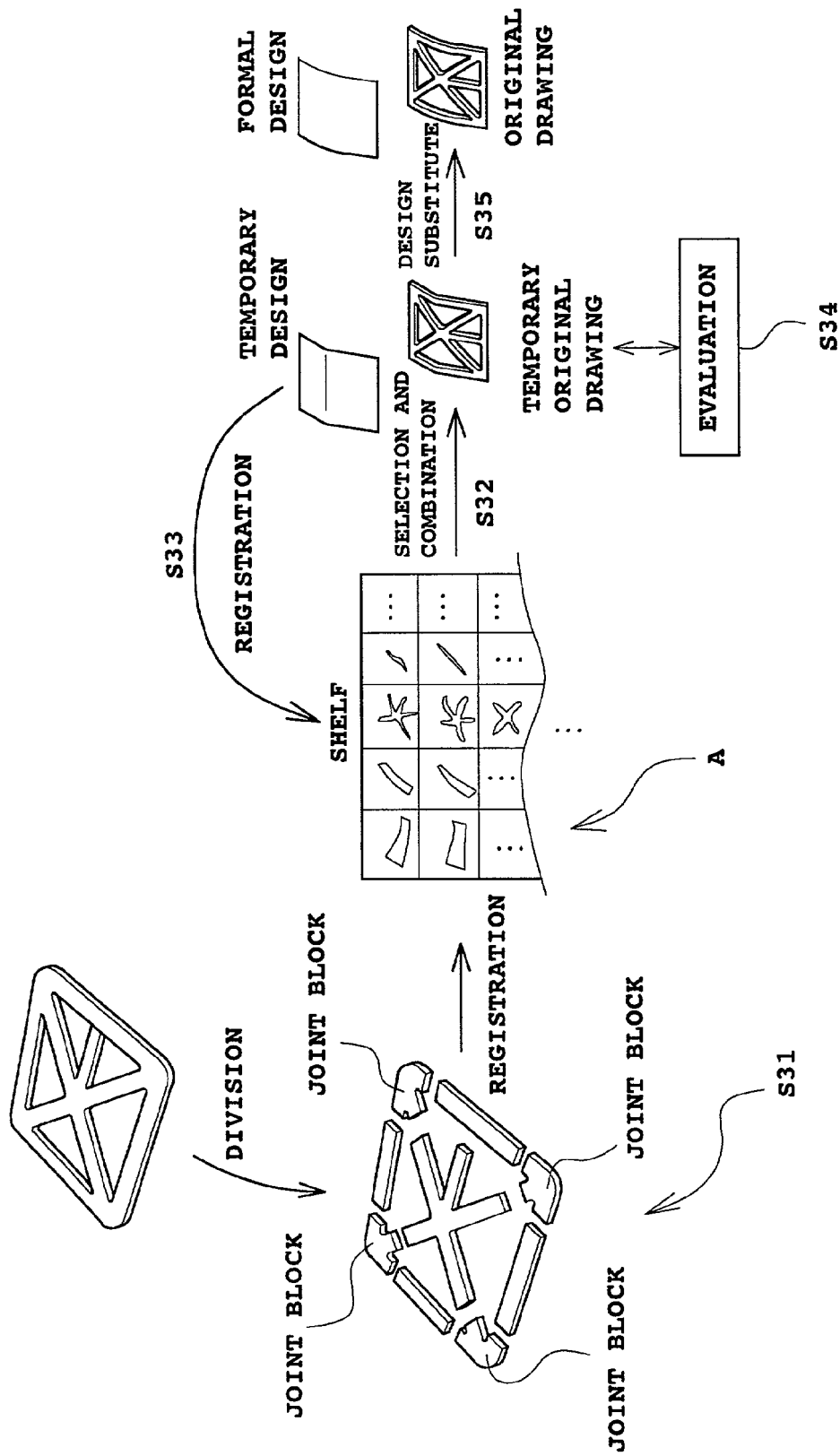
FIG. 10 is a diagram showing a design flow by a design support system of an embodiment.

As described above, the design support system (this system) according to this embodiment can realize the designing flow shown in FIG. 10. Designing of a vehicle will be described below. First, the person in charge of work can divide a history of the design work performed based on a certain body shape design (first standard shape) into predetermined units and register as unit work history data in the database 1 (S31). The unit work history data registered as described above is arranged according to the units of each design target for future reuse to form a "shelf" (A). This system finds a procedure by which the person in charge of work inputs to register for future reuse, requests input of design support information and includes the input design support information in the procedure for registration.

In this stage, the unit work history data to be registered in the database 1 is registered as a general-purpose procedure which does not depend on a particular design or a particular joint relationship. Therefore, when a member conforming to a new body is designed, the above unit work history data can be used to design. In other words, the person in charge of work determines the new body shape based on the shape (second standard shape) presented as a temporary design by a body design department.

Figure 11:
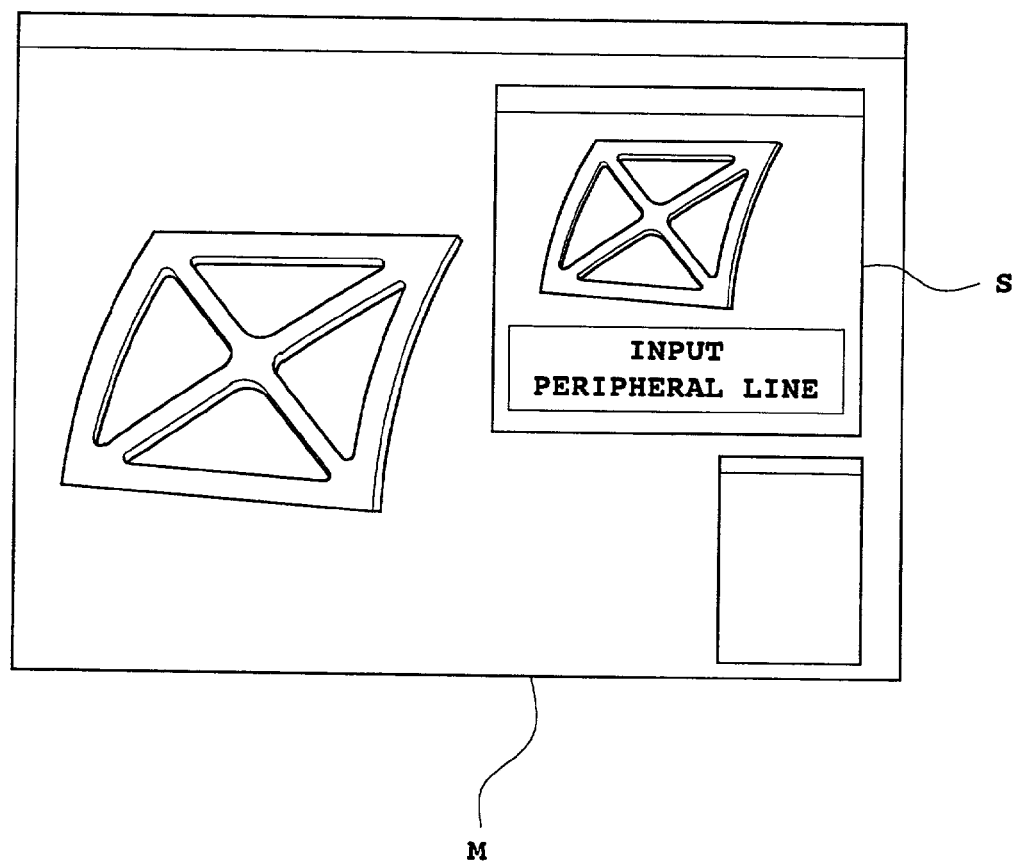
FIG. 11 is an explanatory diagram showing an example of a screen display.

The unit work history data is also fetched from the database 1 ("shelf"), and the design work is conducted (S32). In addition to a main window M reflecting the actual design contents, the unit work history data is reproduced prior to the actual design contents, a sub-window S for design support to indicate the results is shown (FIG. 11), and if there is input design support information, it is shown in the sub-window S. Thus, the person in charge of work can know the input contents to be designated at this time, and the reuse can be implemented smoothly. Here, the person in charge of work may conduct new design work without using the unit work history data.

The person in charge of work operates to utilize the unit work history data or to combine newly designed elements so to create a "joint" for connecting the respective elements to form a combined shape, and designs a member conforming to the second standard shape to create work history data on a temporary original design.

Here, data on the work history obtained by editing the unit work history data or performing the new design work is divided into predetermined units as required, and registered as unit work history data in the database 1 (S33). Thus, reuse and registration are appropriately performed to enhance the contents of the database 1.

Furthermore, it is evaluated in this stage whether the technical character values based on the shape created according to the unit work history data to comply with the second standard shape have the predetermined design requirements and technical production requirements, and the results are shown (S34). After the results are shown, the person in charge of work further edits the work history data and changes the design so to meet the predetermined requirements. Thus, part characteristics can be analyzed in a stage prior to the completion of a formal design, and the design work can be performed smoothly.

When the body design department has completed the design of the formal design (formal design; the third standard shape), the standard shape (reference surface) referenced by the work history data about the temporary original design is replaced, and the work history data about the original design for the formal design is created (S35). Also, the surface groups are made to correspond between the temporary design and the formal design prior to the creation of the work history data about the formal design, and the design can be replaced completely while considering the standard surface, line segment direction, surface direction and the like with reference to the correspondence of the respective surface groups. If the surface group has folding, the work history data for creating a shape conforming to the formal design can be obtained by editing the reference surface or the work history data. The obtained work history data is also used for subsequent processes such as a mold design step.

Figure 12:
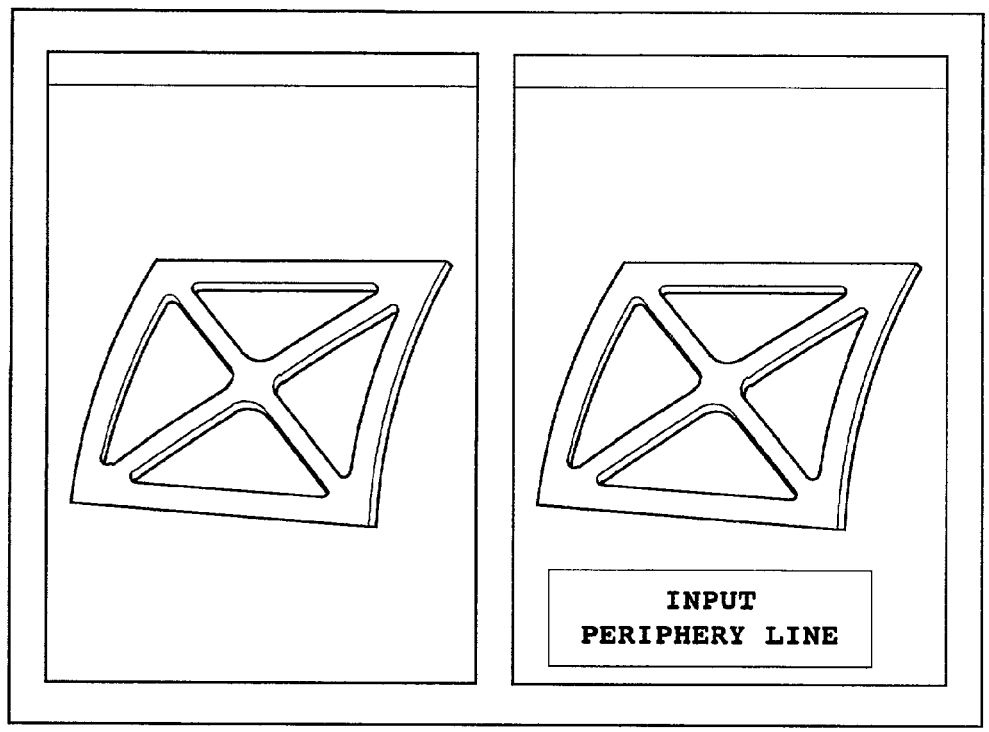
FIG. 12 is an explanatory diagram showing an example of a screen display.
Figure 13:
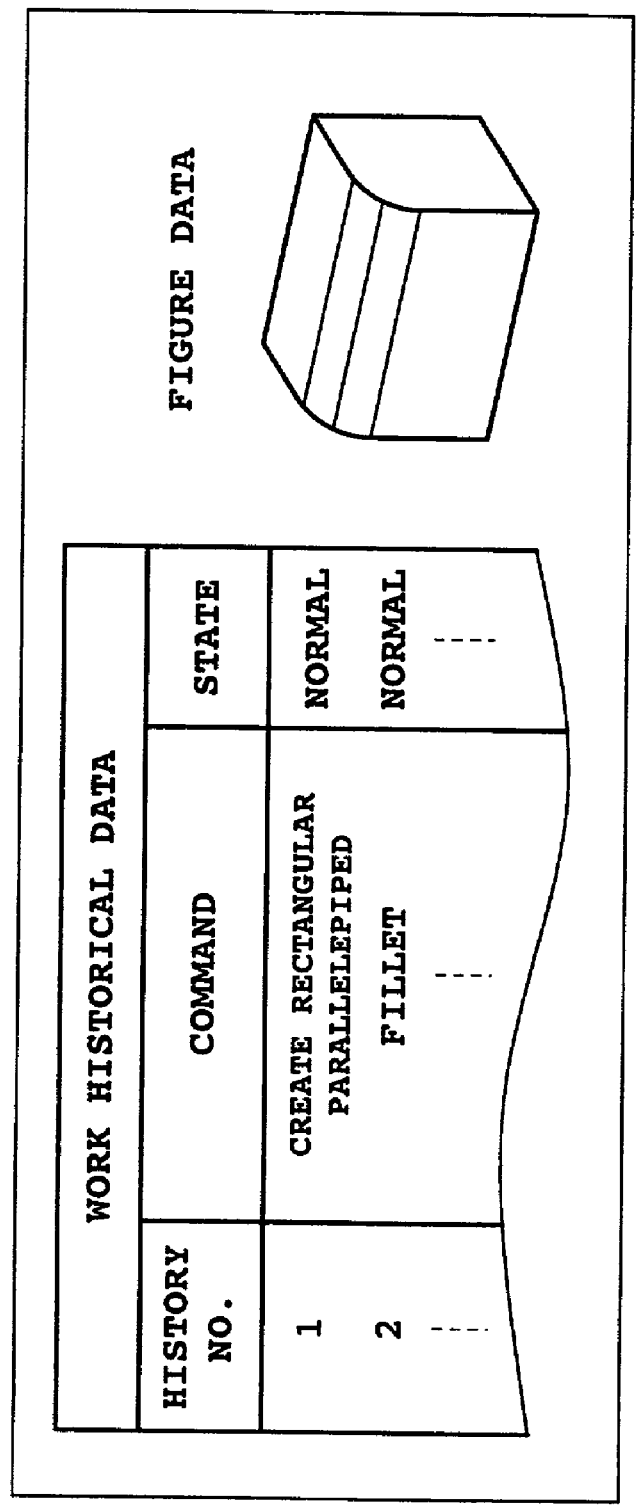
FIG. 13 is an explanatory diagram showing example contents of a design data file.

In the aforementioned description, the design support information is determined to be shown in the sub-window S, but the window for showing design support information and the window for showing the actual design contents may be realized as an independent main window. Such a configuration can be made by, for example, writing a program to separately manage the respective windows in a single design support application or by creating a separate application for each window and operating the applications on a multitask OS. In this case, the respective windows can be tiled (arranged) as shown in FIG. 12, and the window showing the actual design contents can be closed while only the window showing the design support information is displayed.

According to the present invention, the design support system is configured such that the design work history for creating a shape model is divided into parts of the shape model and kept as plural pieces of unit work history data, at least two selected pieces of unit work history data are taken from the plural pieces of unit work history data held and combined, and design work data for creating a combined shape model having the part shape models corresponding to the respective pieces of unit work history data connected is output. Thus, reusability of the past work history data can be improved by making it possible to divide the design work history into pieces for parts, to keep them and to combine them later.

According to the present invention, the design support system, which outputs work data for creating a shape model of a design target in order to create the shape model of the design target conforming to a standard shape, comprises holding a plurality of unit work history data which are obtained by dividing a history of a design work performed with reference to a first standard shape for each design work history corresponding to a shape model of a predetermined portion; accepting designation of data about a second standard shape; fetching multiple unit work history data selected from the multiple unit work history data held to combine them; and reproducing design work with reference to the designated second standard shape for the design work performed with reference to the first standard shape among the design work contained in the unit work history data, and outputting work data corresponding to a combined shape model conforming to the second standard shape. Thus, reusability of the past work history data can be improved by making it possible to divide the design work history into pieces for parts, to keep them and to combine them later.

According to the present invention, the design support system, which holds a series of design work histories to reuse as work history data and creates a shape based on the work history data, comprises the steps of analyzing the work history data to extract input work performed by a person in charge of work; showing the extracted input work to the person in charge of work to receive input of design support information; and recording the design support information in the work history data when the design support information is input so to show when the design support information is reused. Thus, reusability of the work history data is promoted, and design work efficiency is improved.

Reusability can be improved furthermore because the work history data is divided into predetermined work units for each design target and separately stored as unit work history data.

Besides, according to the present invention, the design support system comprises the step of accumulating unit work history data which is formed by dividing a history of past design work into work units determined for each design target and contains design support information related to input work in the design work; selectively showing the unit work history upon receiving designation of the design target; creating a shape by sequentially reproducing the selected unit work history; and providing design support information related to input work when the input work is demanded while the unit work history is being reproduced. Thus, understanding of the meaning and content of each input work is additionally facilitated by virtue of the design support information, reuse of the work history data is promoted, and efficiency of the design work is improved.

Here, it is judged whether the work history to be reproduced agrees with predetermined guidance display conditions while the unit work history is being reproduced and, if the work history agrees with the guidance display conditions, a guidance display determined in connection with the conditions is carried out. Accordingly, more detailed information is provided to facilitate understanding of the work history data and to provide additional improvement of the design work efficiency.

While there have been described what are at present considered to be preferred embodiments of the invention, it is to be understood that various modifications may be made thereto, and it is intended that the appended claims cover all such modifications as fall within the true spirit and scope of the invention.

What is claimed is:

1. A design support system, comprising:
a database which divides a history of design work for creating a shape model, comprising a first reference surface, for each part of the shape model and holds a plurality of design work histories as unit work history data, the database accumulating technical conditions, which are to be met by a part shape model to be created according to each unit work history data, in association with each unit work history data; and
a control section configured to:
fetch at least two unit work history data selected from the plurality of unit work history data held by the database;
combine the at least two selected unit work history data and output design work data for creating a combined shape model, comprising a second reference surface, which is formed by sequentially reproducing the selected unit work history data one by one in accordance with an inputted user approval for each input work history datum and joining part shape models corresponding to the respective selected unit work history data;
create a corresponding surface group in accordance with user input of a correspondence between the first reference surface and the second reference surface;
determine, using the corresponding surface group, errors in the combined shape model arising from the second reference surface;
compute at least one technical characteristic value of the combined shape model which is created from the output design work data; and
compare the computed technical characteristic value with the technical conditions related to unit work history data which is the origin of the design work data;
wherein the computation of the at least one technical characteristic value comprises analyzing the strength of the combined shape model, and
wherein the errors determined using the corresponding surface group include at least one of a change of a number of configuring surfaces, a change in direction or quantity of border lines, reversal of a direction of a surface, and folding of a surface.

2. The design support system according to claim 1, wherein the control section is further configured to:
analyze the history of design work and extract input work carried out by a person in charge of work when unit historical data is created; and the design support system further including:
a display section which shows the extracted input work to the person in charge of work to request input of design support information; and
a database which records the design support information in a history of the design work and divides the history of the design work into unit historical data when the design support information is input.

3. A design support system which outputs work data for creating a shape model, comprising a first reference surface, of a design target in order to create the shape model of the design target conforming to a standard shape, comprising:
a database which holds a plurality of unit work history data which are obtained by dividing a history of a design work performed with reference to a first standard shape for each design work history corresponding to a shape model of a predetermined portion, the database accumulating technical conditions, which are to be met by a part shape model to be created according to each unit work history data, in association with each unit work history data; and
a control section configured to:
receive designation of data about a second standard shape;
fetch multiple unit work history data held by the database;
combine each of the fetched unit work history data, sequentially reproduce unit work history data one by one in accordance with an inputted user approval for each input work history datum, reproduce design work with reference to the designated second standard shape for the design works performed with reference to the first standard shape among the design works contained in the unit work history data, and output work data corresponding to a combined shape model, comprising a second reference surface conforming to the second standard shape;
create a corresponding surface group in accordance with user input of a correspondence between the first reference surface and the second reference surface;
determine, using the corresponding surface group, errors in the combined shape model arising from the second reference surface;
compute at least one technical characteristic value of the combined shape model which is created from the output work data; and
compare the computed technical characteristic value with the technical conditions related to unit work history data which is the origin of the work data;
wherein the computation of the at least one technical characteristic value comprises analyzing the strength of the combined shape model, and
wherein the errors determined using the corresponding surface group include at least one of a change of a number of configuring surfaces, a change in direction or quantity of border lines, reversal of a direction of a surface, and folding of a surface.

4. The design support system according to claim 2, wherein the control section is further configured to:
receive designation of data about a third standard shape; wherein:
the work data is converted by reproducing a design work with reference to the designated third standard shape for work included in the work contained in the output work data and performed with reference to the second standard shape, and converted work data corresponding to the shape model conforming to the third standard shape is output.

5. A design support system which holds a series of design work histories to reuse as work history data and creates a shape based on the work history data, comprising:
a control section which:
analyzes the work history data, comprising a first reference surface, by sequentially reproducing unit work history data one by one to extract input work in accordance with an inputted user approval for each work history datum, comprising a second reference surface, carried out by a person in charge of work,
creates a corresponding surface group in accordance with user input of a correspondence between the first reference surface and the second reference surface, determines, using the corresponding surface group, errors in the extracted input work arising from the second reference surface, computes at least one technical characteristic value of the shape which is created based on the work history data, and compares the computed technical characteristic value with technical conditions related to the work history data, wherein the computation of the at least one technical characteristic value comprises analyzing the strength of the shape;

a display section which shows the extracted input work to the person in charge of work to request input of design support information; and a database which records the design support information in the work history data when the design support information is input, the database accumulating technical conditions, which are to be met by the shape created based on the work history data, in association with the work history data;

wherein the errors determined using the corresponding surface group include at least one of a change of a number of configuring surfaces, a change in direction or quantity of border lines, reversal of a direction of a surface, and folding of a surface.

6. The design support system according to claim 5, wherein the database is further configured to:

generate unit work history data by dividing the work history data into predetermined work units for a design target.

7. A design support system, comprising:

a database which accumulates unit work history data which is formed by dividing a history of past design work, comprising a first reference surface, into work units determined for a design target and contains design support information related to input work among the design work, the database accumulating technical conditions, which are to be met by a part shape model to be created according to each unit work history data, in association with each unit work history data;

a control device section configured to:
  selectively show the unit work history on a display section upon receiving designation of the design target;
  create a shape comprising a second reference surface by sequentially reproducing the selected unit work history data one by one in accordance with an inputted user approval for each work history datum;
  provide design support information related to input work when the input work is demanded while the unit work history is being reproduced;
  create a corresponding surface group in accordance with user input of a correspondence between the first reference surface and the second reference surface;
  determine, using the corresponding surface group, errors in the shape arising from the second reference surface;
  compute at least one technical characteristic value of the shape which is created from the unit work history data; and
  compare the computed technical characteristic value with the technical conditions related to unit work history data;

wherein the computation of the at least one technical characteristic value comprises analyzing the strength of the shape, and wherein the errors determined using the corresponding surface group include at least one of a change of a number of configuring surfaces, a change in direction or quantity of border lines, reversal of a direction of a surface, and folding of a surface.

8. The design support system according to claim 7, wherein the control section is further configured to:

judge whether the work history to be reproduced agrees with predetermined guidance display conditions while the unit work history is being reproduced; and wherein the display section is further configured to implement a guidance display determined in connection with the guide display conditions if the work history agrees with the guidance display conditions.

9. A design support system, comprising:

a database which accumulates unit work history data which is formed by dividing a history of past design work into work units, comprising a first reference surface, determined for a design target and contains design support information related to an input work among the design work, the database accumulating technical conditions, which are to be met by a part shape model to be created according to each unit work history data, in association with each unit work history data;

a first display device which shows a shape comprising a second reference surface of the design target obtained by sequentially reproducing a history of the design work data one by one with reference to the unit work history data in accordance with an inputted user approval for each work history datum;

a second display device which shows design support information contained in the unit work history data by reproducing a history of a design work prior to the reproduction at the first display device; and a control section which:

creates a corresponding surface group in accordance with user input of a correspondence between the first reference surface and the second reference surface;

determines, using the corresponding surface group, errors in the shape arising from second reference surface;

computes at least one technical characteristic value of the shape which is created by sequentially reproducing the history of the design work with reference to the unit work history data, and compares the computed technical characteristic value with the technical conditions related to unit work history;

wherein the computation of the at least one technical characteristic value comprises analyzing the strength of the shape, and wherein the errors determined using the corresponding surface group include at least one of a change of a number of configuring surfaces, a change in direction or quantity of border lines, reversal of a direction of a surface, and folding of a surface.

10. A design support method using a computer, wherein:

a series of design work histories are held in multiple quantities as work history data, comprising a first reference surface, in a database in order to create a part shape model;

technical conditions are accumulated in the database, which are to be met by the part shape model to be created according to each work history data, in association with each work history data;

at least two selected work history data are fetched from the held multiple work history data according to an instruction input to a processor;

design work data for creating a one-piece shape model comprising a second reference surface by sequentially reproducing unit work history data one by one in accordance with an inputted user approval for each work history datum and combining the at least two fetched work history data and connecting part shape models corresponding to the respective work history data is output;

a corresponding surface group is created by a control section in accordance with user input of a correspondence between the first reference surface and the second reference surface;

errors in the one-piece shape model arising from the second reference surface are determined, using the corresponding surface group, by the control section;

at least one technical characteristic value of the one-piece shape model which is created from the design work data is computed; and the computed technical characteristic value is compared with the technical conditions related to work history data which is the origin of the design work data;

wherein the computation of the at least one technical characteristic value comprises analyzing the strength of the one-piece shape model, and wherein the errors determined using the corresponding surface group include at least one of a change of a number of configuring surfaces, a change in direction or quantity of border lines, reversal of a direction of a surface, and folding of a surface.

11. A design support method which uses a computer to create a shape model of a design target conforming to a desired standard shape according to input to its processor and outputs work data for creating the shape model of the design target, comprising the steps of:

holding a plurality of histories of design work performed in the past with reference to the respective standard shapes, comprising a first reference surface, in a database as work history data;

accumulating in the database technical conditions, which are to be met by a part shape model to be created according to each work history data, in association with each work history data;

accepting designation of data about a second standard shape, which is a desired standard shape, according to an instruction input to the processor;

fetching the selected multiple work history data from the multiple work history data held in the database;

combining respective pieces of the fetched work history data, sequentially reproducing unit work history data one by one in accordance with an inputted user approval for each input work history datum, reproducing design work with reference to the designated second standard shape for the design work performed in the past with reference to the respective standard shapes among the design work contained in the work history data, and outputting work data corresponding to a combined shape model, comprising a second reference surface, conforming to the second standard shape;

creating a corresponding surface group in accordance with user input of a correspondence between the first reference surface and the second reference surface;

determining, using the corresponding surface group, errors in the combined shape model arising from the second reference surface;

computing at least one technical characteristic value of the combined shape model which is created from the fetched work history data; and comparing the computed technical characteristic value with the technical conditions related to work history data;

wherein the computation of the at least one technical characteristic value comprises analyzing the strength of the combined shape model, and wherein the errors determined using the corresponding surface group include at least one of a change of a number of configuring surfaces, a change in direction or quantity of border lines, reversal of a direction of a surface, and folding of a surface.

12. A design support method which holds a series of design work histories as work history data in order for reuse and generates a shape by a computer according to the work history data according to an instruction input to a processor, comprising the steps of:

accumulating in a database technical conditions, which are to be met by a part shape model to be created according to each work history data, comprising a first reference surface, in association with each work history data;

analyzing the work history data by sequentially reproducing unit work history data one by one in accordance with an inputted user approval for each work history datum upon input to the processor to extract the input work, comprising a second reference surface, performed by a person in charge of work;

showing the extracted input work to the person in charge of work to request input of design support information;

when the design support information is input, recording the design support information in the work history data;

creating a corresponding surface group in accordance with user input of a correspondence between the first reference surface and the second reference surface;

determining, using the corresponding surface group, errors in the extracted input work arising from the second reference surface;

computing at least one technical characteristic value of the shape which is created from the work history data; and comparing the computed technical characteristic value with the technical conditions related to work history data;

wherein the computation of the at least one technical characteristic value comprises analyzing the strength of the shape, and wherein the errors determined using the corresponding surface group include at least one of a change of a number of configuring surfaces, a change in direction or quantity of border lines, reversal of a direction of a surface, and folding of a surface.

13. A design support method, comprising the steps of:

accumulating, using a computer, unit work history data which is formed by dividing a history of past design work into work units, comprising a first reference surface, determined for a design target and contains design support information related to input work among the design work;

accumulating, using the computer, technical conditions, which are to be met by a part shape model to be created according to each unit work history data, in association with each unit work history data;

showing the unit work history selectively upon receiving designation of the design target by the computer;

creating a shape, comprising a second reference surface, by sequentially reproducing the selected unit work history data one by one in accordance with an inputted user approval for each work history datum;

providing the design support information related to input work when the input work is demanded while the unit work history is being reproduced;

creating a corresponding surface group in accordance with user input of a correspondence between the first reference surface and the second reference surface;
determining, using the corresponding surface group, errors in the shape arising from the second reference surface;
computing at least one technical characteristic value of the shape which is created from the unit work history; and
comparing the computed technical characteristic value with the technical conditions related to unit work history data;
wherein the computation of the at least one technical characteristic value comprises analyzing the strength of the shape, and
wherein the errors determined using the corresponding surface group include at least one of a change of a number of configuring surfaces, a change in direction or quantity of border lines, reversal of a direction of a surface, and folding of a surface.

14. The design support method according to claim 13, wherein it is judged whether the work history to be reproduced conforms to predetermined guidance display conditions while the unit work history data is being reproduced by the computer and, if it conforms to the guidance display conditions, a guidance display determined in connection with the guide display conditions is performed.

15. A recording medium storing a design support program and being computer-readable, the design support program comprising:
a module holding a series of design work histories as a plurality of work history data, comprising a first reference surface, for creation of a part shape model, comprising a second reference surface;
a module accumulating technical conditions, which are to be met by the part shape model;
a module fetching at least two selected work history data from the held multiple work history data;
a module outputting design work data for creating a one-piece shape model by sequentially reproducing unit work history data one by one in accordance with an inputted user approval for each input work history datum and combining the at least two fetched work history data and connecting part shape models corresponding to the respective work history data;
a module creating a corresponding surface group in accordance with user input of a correspondence between the first reference surface and the second reference surface;
a module determining, using the corresponding surface group, errors in the part shape model arising from the second reference surface;
a module computing at least one technical characteristic value of the one-piece shape model which is created from the design work data; and
a module comparing the computed technical characteristic value with the technical conditions related to work history data which is the origin of the design work data;
wherein the computation of the at least one technical characteristic value comprises analyzing the strength of the one-piece shape model, and
wherein the errors determined using the corresponding surface group include at least one of a change of a number of configuring surfaces, a change in direction or quantity of border lines, reversal of a direction of a surface, and folding of a surface.

16. A recording medium storing a design support program and being computer-readable, the design support program comprising:
a module outputting work data for creating a shape model of a design target in order to create the shape model of the design target conforming to a desired standard shape;
a module holding a history of design work performed with reference to a first standard shape, comprising a first reference surface, as a plurality of work history data;
a module accumulating technical conditions, which are to be met by the shape model;
a module receiving designation of data about a second standard shape, comprising a second reference surface, which is a desired standard shape;
a module fetching the selected multiple work history data from the held multiple work history data;
a module combining each of the fetched work history data, sequentially reproducing unit work history data one by one in accordance with an inputted user approval for each input work history datum, reproducing design work with reference to the designated second standard shape for the design works performed with reference to the first standard among the design works contained in the work history data, and outputting work data corresponding to a one-piece shape model conforming to the second standard shape;
a module creating a corresponding surface group in accordance with user input of a correspondence between the first reference surface and the second reference surface;
a module determining, using the corresponding surface group, errors in the second standard shape caused by the second reference surface;
a module computing at least one technical characteristic value of the one-piece shape model which is created from the design work; and
a module comparing the computed technical characteristic value with the technical conditions related to work history data which is the origin of the design work;
wherein the computation of the at least one technical characteristic value comprises analyzing the strength of the one-piece shape model, and
wherein the errors determined using the corresponding surface group include at least one of a change of a number of configuring surfaces, a change in direction or quantity of border lines, reversal of a direction of a surface, and folding of a surface.

17. A recording medium storing a design support program and being computer-readable, the design support program comprising:
a module holding a series of design work histories, comprising a first reference surface, to reuse as work history data;
a module accumulating technical conditions, which are to be met by a part shape model to be created according to each work history data, in association with each work history data;
a module analyzing the work history data by sequentially reproducing unit work history data one by one in accordance with an inputted user approval for each work history datum to extract input work performed by a person in charge of work;
a module showing the extracted input work, comprising a second reference surface, to the person in charge of work to request input of design support information;
a module recording the design support information in the work history data when the design support information is input;

a module creating a corresponding surface group in accordance with user input of a correspondence between the first reference surface and the second reference surface;

a module determining, using the corresponding surface group, errors in the extracted input work arising from the second reference surface;

a module computing at least one technical characteristic value of the extracted input work which is created from the work history data; and a module comparing the computed technical characteristic value with the technical conditions related to work history data;

wherein the computation of the at least one technical characteristic value comprises analyzing the strength of the extracted input work, and wherein the errors determined using the corresponding surface group include at least one of a change of a number of configuring surfaces, a change in direction or quantity of border lines, reversal of a direction of a surface, and folding of a surface.

18. A recording medium storing a design support program and being computer-readable, the design support program comprising:

a module accumulating unit work history data which is formed by dividing a history of past design work into work units, comprising a first reference surface, determined for a design target and contains design support information related to input work among the design work;

a module accumulating technical conditions, which are to be met by a part shape model to be created according to each unit work history data, in association with each unit work history data;

a module selectively showing the unit work history upon receiving designation of the design target;

a module creating a shape, comprising a second reference surface, by sequentially reproducing the selected unit work history data one by one in accordance with an inputted user approval for each work history datum;

a module providing design support information related to an input work when the input work is demanded while the unit work history is being reproduced;

a module creating a corresponding surface group in accordance with user input of a correspondence between the first reference surface and the second reference surface;

a module determining, using the corresponding surface group, errors in the shape arising from the second reference surface;

a module computing at least one technical characteristic value of the shape which is created from the unit work history data; and a module comparing the computed technical characteristic value with the technical conditions related to unit work history data;

wherein the computation of the at least one technical characteristic value comprises analyzing the strength of the shape, and wherein the errors determined using the corresponding surface group include at least one of a change of a number of configuring surfaces, a change in direction or quantity of border lines, reversal of a direction of a surface, and folding of a surface.

19. The recording medium being computer-readable according to claim 18, wherein:

the design support program in the recording medium further includes a module judging whether the work history to be reproduced agrees with predetermined guidance display conditions while the unit work history is being reproduced and, if the work history agrees with the guidance display conditions, implements a guidance display determined in connection with the conditions.

20. A design support system, comprising:

a database which divides a history of design work for creating a shape model, comprising a first reference surface, for each part of the shape model and holds a plurality of design work histories as unit work history data; and a control section configured to:

fetch at least two unit work history data selected from the plurality of unit work history data held by the database;

combine the at least two selected unit work history data and output design work data for creating a combined shape model, comprising a second reference surface, which is formed by sequentially reproducing the unit work history data one by one in accordance with an inputted user approval for each input work history datum and joining part shape models corresponding to the respective unit work history data;

create a corresponding surface group in accordance with user input of a correspondence between the first reference surface and the second reference surface; and determine, using the corresponding surface group, errors in the combined shape model arising from the second reference surface;

wherein the errors determined using the corresponding surface group include at least one of a change of a number of configuring surfaces, a change in direction or quantity of border lines, reversal of a direction of a surface, and folding of a surface.

* * * * *